United States Patent [19]
Immel

[11] Patent Number: 5,769,916
[45] Date of Patent: Jun. 23, 1998

[54] FILTER VENTILATOR

[75] Inventor: Manfred Immel, Mittenaar-Bicken, Germany

[73] Assignee: Rittal—Werk Rudolf Loh GmbH & Co. KG, Herborn, Germany

[21] Appl. No.: 726,144

[22] Filed: Oct. 4, 1996

[30] Foreign Application Priority Data

Oct. 4, 1995 [DE] Germany .................. 195 36 928.9

[51] Int. Cl.⁶ .................................................. B01D 27/08
[52] U.S. Cl. .......................... 55/495; 55/473; 55/504; 454/272; 454/283; 454/329; 454/354
[58] Field of Search .................... 55/309, 357, 490, 55/493, 497, 508, 521, 385.4, 422, 467, 473, 495, 501, 504; 454/272, 277, 283, 329, 332, 350, 354

[56] References Cited

U.S. PATENT DOCUMENTS

| | | | |
|---|---|---|---|
| 2,043,934 | 6/1936 | Spear | 454/329 |
| 2,153,576 | 4/1939 | Kurth et al. | 454/272 |
| 2,580,797 | 1/1952 | Koch | 454/350 |
| 3,116,679 | 1/1964 | Solem | 454/350 |
| 3,204,546 | 9/1965 | Krell | 454/272 |
| 3,791,281 | 2/1974 | Steiner | 454/350 |
| 3,902,877 | 9/1975 | Swaim | 55/490 |
| 4,385,911 | 5/1983 | Popeil et al. | 55/504 |
| 4,699,045 | 10/1987 | Hensley . | |
| 4,896,590 | 1/1990 | Groos | 55/385.4 |
| 5,273,563 | 12/1993 | Pasch et al. | 55/521 |
| 5,273,564 | 12/1993 | Hill | 55/521 |

FOREIGN PATENT DOCUMENTS

| | | |
|---|---|---|
| 8910047 | 10/1990 | Germany . |
| 9010394 | 11/1990 | Germany . |
| 9306032 | 1/1994 | Germany . |

Primary Examiner—C. Scott Bushey
Attorney, Agent, or Firm—Speckman Pauley Peterson & Fejer

[57] ABSTRACT

A filter ventilator for installation in an opening of a wall of a switchgear cabinet or the like, having a base housing receiving the filter, which is covered with a finned screen and which is connected with a ventilator on a side facing away from the finned screen. For a considerably simplified mounting of the filter ventilator, detent cams are molded on the base housing for fastening the ventilator. The detent cams engage bores in the facing flange of the ventilator. L-shaped holding elements are formed on the base housing which, facing the flange of the ventilator which faces away from the finned screen, have detent cams which engage bores of the flange. The L-shaped holding elements and the base housing form receivers, into which the ventilator, which is placed angularly offset on the base housing, can be rotated to a stop.

12 Claims, 1 Drawing Sheet

FILTER VENTILATOR

BACKGROUND OF THE INVENTION

1. Field of the Invention

This invention relates to a filter ventilator for installation in an opening of a wall of a switchgear cabinet or the like, having a base housing receiving the filter, which is covered with a finned screen and which is connected with a ventilator on the side away from the finned screen.

2. Description of Prior Art

A filter ventilator of this type is known from German Patent Publication DE 90 10 394 U1. The filter is inserted into the base housing and is covered with the finned screen. A ventilator is disposed on the side of the base housing facing away from the finned screen, wherein screw connections are disposed in the corner areas of the rectangular base housing and the ventilator. The corner areas of the base housing are specially embodied so that the mounted filter ventilator can be locked into the opening in the wall.

Mounting the filter ventilator takes very much time and requires a multitude of fastening means, particularly if for safety reasons it is intended to provide protection against touching, the side of the ventilator facing away from the base housing must also have a protective screen.

SUMMARY OF THE INVENTION

It is one object of this invention to provide a filter ventilator of the general type described above wherein the outlay for parts and assembly can be considerably reduced.

In accordance with this invention, this object is attained with detent cams that are molded on the base housing for fastening the ventilator, which engage bores in the facing flange of the ventilator. L-shaped holding elements are formed on the base housing which, facing the flange of the ventilator which faces away from the finned screen, have detent cams which engage bores of the flange. The L-shaped holding elements and the base housing form receivers, into which the ventilator, which is positioned angularly offset on the base housing, can be rotated until it comes to a stop.

The parts required for fastening the ventilator on the base housing are components of the two units which are to be combined with each other. Assembly is limited to placing the ventilator angularly offset with respect to the base housing and subsequent rotating of the ventilator until it is engaged in the receivers.

In accordance with a preferred embodiment, the base housing is shaped essentially square and has detent cams which are molded in all corner areas. The ventilator is shaped essentially round and has essentially square flanges on both sides with bores oriented toward the detent cams of the base housing. The corner areas of the flanges are rounded.

If the L-shaped holding elements extend over a part of a side of the flange and an adjoining curve of the corner area, the holding elements are formed on all corner areas of the base housing in such a way that the ventilator can be rotated in a clockwise direction into the holding elements, and four holding elements partially cover the four sides of the flange, then the holding elements, which are L-shaped in cross section, do not hamper the rotation of the ventilator into the receivers and at the same time the holding elements secure the rotated-in ventilator on all sides.

So that air flow is not affected, in a further embodiment of this invention the detent cams of the base housing are formed at its bottom, which itself is embodied to operate like a screen.

If the side of the ventilator facing away from the base housing is to be covered with a protective screen, it is just as simple as installing the fan and the screen because a protective screen can be placed on the side of the ventilator facing away from the base housing, which has brackets with detent cams and detent receivers in its corner areas. Prior to rotating the ventilator into the receivers formed by the L-shaped holding elements and the base housing, the detent cams of the protective screen are inserted or placed into the bores of the facing flange of the ventilator. When rotating-in the ventilator with the protective screen, the detent cams of the holding elements engage the detent receivers of the brackets of the protective screen. In this embodiment, the detent cams and the detent receivers of the protective screen preferably are axially aligned with each other. In order to obtain a sufficiently firm seating of the ventilator and the protective screen in the receivers, in another preferred embodiment the distance of the end legs of the holding elements from the bottom of the cup-like base housing corresponds to the structural height of the ventilator including the brackets of the protective screen.

This invention will be explained in detail by means of an exemplary embodiment represented in the drawings.

DESCRIPTION OF PREFERRED EMBODIMENTS

Figure 1:
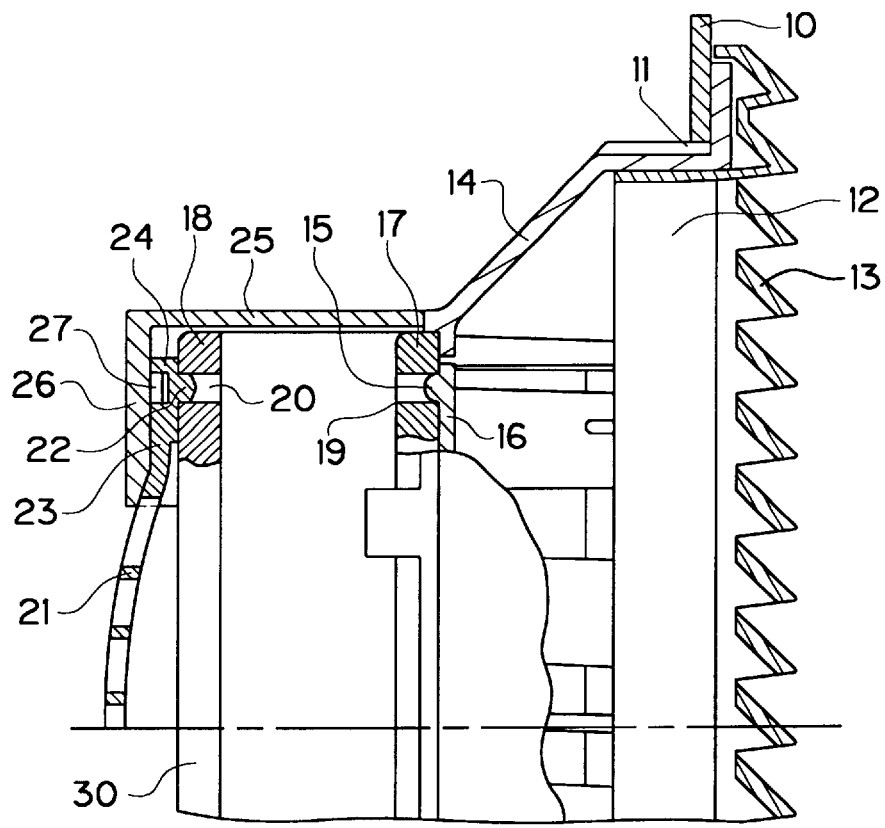
FIG. 1 is a partial sectional view of a filter ventilator, together with the fastening of the ventilator by angularly offset placement and rotation into receivers of the base housing, according to one preferred embodiment of this invention.

The basic structure of the filter ventilator will be explained in detail first. Referring to FIG. 1, the wall 10, for example of a switchgear cabinet, has a square opening 11 in which the finally assembled filter ventilator is positioned or locked.

The filter ventilator has a cup-shaped base housing 14, with a bottom 16 embodied as a screen in order not to unnecessarily hamper the air flow. The base housing 14 receives a filter mat 12 which is covered with a ribbed screen 13 which also covers the filter ventilator toward the outside. Detent cams 15 are formed on the bottom 16 in the four corner areas. The ventilator 30 is essentially round in cross section and is closed off on both sides with essentially square flanges 17 and 18. As partially shown in FIG. 2, the flanges 17 and 18 have rounded corners.

Figure 2:
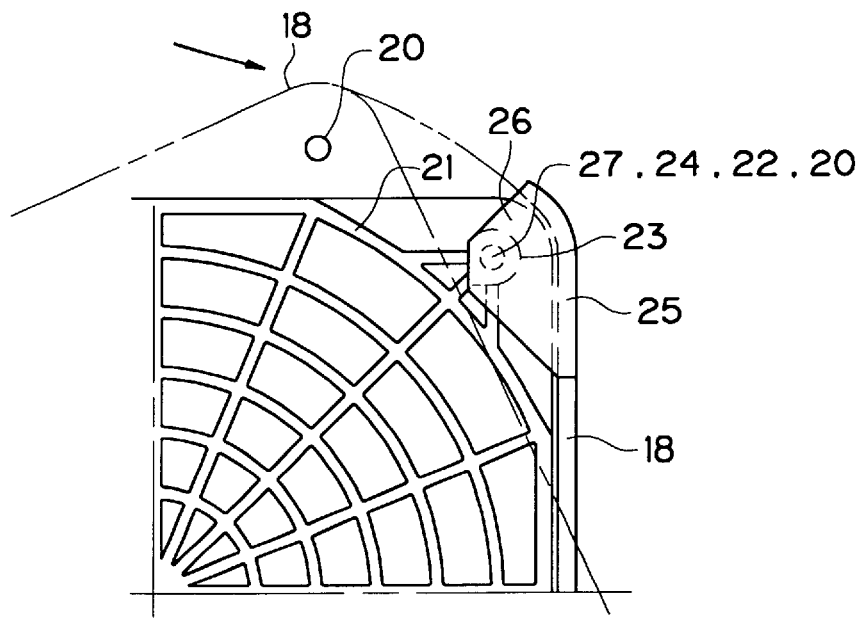
FIG. 2 is a partial front view of an end section of an L-shaped holding element, according to one preferred embodiment of this invention.

In the projecting corner areas, the flanges 17 and 18 have bores 19 and 20, which can be aligned with the detent cams 15 of the base housing 14. In addition, L-shaped holding elements 25 are formed in the corner areas on the bottom 16 of the housing 14 which, together with the bottom 16 of the base housing 14, form receivers into which the ventilator 30, which is positioned angularly offset against the housing 14, can be rotated. So that this is possible, the holding elements 25 extend over a portion of a side of the flange 18 and the adjoining curve, as shown in FIG. 2. If all holding elements 25 are arranged equally in a clockwise direction, the flange 18 can then be rotated in without a problem, so that each side of the flange 18 is fixed in place by one of the holding elements 25. In this case the alignment is such that the 10 ventilator 30, which is rotated in until the ventilator 30 stops, is locked with the base housing 14. The detent cams 15 engage the bores 19 of the flange 17, and further detent cams 27, formed on the inside of the end section 26 of the holding element 25, result in further locking.

Prior to the ventilator 30 being positioned and rotated-in, a protective screen 21 is connected, for example locked, with the flange 18 of the ventilator 30. In this embodiment, the protective screen 21 has brackets 23 formed in the corner areas, which have a detent cam 22 and an axially flush detent receiver 24. The detent cams 22 of the protective screen 21 are fixed in place in the bores 20 of the flange 18, as shown in the sectional view in FIG. 1. For this reason the ventilator 30 and the protective screen 21 form a unit, which can be placed angularly offset against the base housing 14 and rotated into the receivers of the holding elements 25. In the process the detent cams 27 of the end sections 26 of the holding elements 25 engage the detent receivers 24 of the brackets 23 of the protective screen 21. As shown in FIG. 1, the ventilator 30 with the protective screen 21 is engagingly connected in this way with the base housing 14. The end sections 26 of the holding elements 25 are at a distance from the bottom 16 of the base housing 14, which corresponds to the structural height of the ventilator 30 and the bracket 23 of the protective screen 21.

If a protective screen 21 is not required, the detent cams 27 of the end sections 26 of the holding elements 25 directly engage the bore 20 of the flange 18. In this case the distance between the end sections 26 of the holding elements 25 and the bottom 16 of the base housing 14 is then reduced by the thickness of the brackets 23 in order to obtain a clear axial fix of the ventilator 30 on the base housing 14.

What is claimed is:

1. In a filter ventilator for installation in an opening of a wall of a structure, having a base housing receiving a filter, which is covered with a finned screen and is connected with a ventilator on a side of the housing away from the finned screen, the improvement comprising:

a plurality of first detent cams (15) molded on the base housing (14), a first flange (17) positioned on a near side of the ventilator (30) having a plurality of first bores (19) which correspondingly engage with the first detent cams (15);

a plurality of L-shaped holding elements (25) attached to the base housing (14) and facing a second flange (18) positioned on a far side which is opposite the near side of the ventilator (30), the far side being positioned further away than the near side from the finned screen (13), each of the L-shaped holding elements (25) having a second detent cam (27), each of the L-shaped holding elements (25) having an end section (26) extending beyond the far side of the ventilator (30), the second flange (18) of the ventilator (30) having a plurality of second bores (20) which correspondingly engage with the second detent cams (27); and the L-shaped holding elements (25) and the base housing (14) forming a plurality of receivers into which the ventilator (30) is rotated into a locked position with respect to the base housing (14).

2. In a filter ventilator in accordance with claim 1, wherein the base housing (14) is generally square and has the dent cams (15) located corner areas of the base housing (14), the ventilator (30) is generally round and has generally square flanges (17, 18) on both sides and bore (19, 20) oriented toward the first dent cams (15) of the base housing (14), and each of plurality of corner area of the flanges (17, 18) are rounded.

3. In a filter ventilator in accordance with claim 2, wherein the L-shaped holding elements (25) extend over a part of a side of the second flange (18) and an adjoining curved portion of the corner area, the L-shaped holding elements (25) are located at all corner areas of the base housing (14) such that the ventilator (30) is rotatable in a clockwise direction into the L-shaped holding elements (25), and the L-shaped holding elements (25) partially cover four sides of the second flange (18).

4. In a filter ventilator in accordance with claim 3, wherein the first detent cams (15) of the base housing (14) are positioned at bottom (16) which is formed as a screen.

5. In a filter ventilator in accordance with claim 4, wherein a protective screen (21) is positioned on a side of the ventilator (30) facing away from the base housing (14), the protective screen (21) has a plurality of brackets (23) each with a third detent cam (22) and a detent receiver (24) in an end area of the corresponding bracket (23), the flange (18) of the ventilator (30) has a plurality of third bores (20) which correspondingly engage with the third detent cams (22), the brackets (23) of the protective screen (21) form a plurality of detent receivers (24), and when rotating the ventilator (30) with the protective screen (21) the second detent cams (27) of the L-shaped holding elements (25) engage with the detent receivers (24).

6. In a filter ventilator in accordance with claim 5, wherein the third detent cams (22) and the detent receivers (24) of the protective screen (21) are axially aligned with each other.

7. In a filter ventilator in accordance with claim 6, wherein a distance of each of the end sections (26) of the holding L-shaped elements (25) from the bottom (16) of the base housing (14) corresponds to a structural height of the ventilator (30) and the brackets (23) of the protective screen (21).

8. In a filter ventilator in accordance with claim 1, wherein the L-shaped holding elements (25) extend over a part of a side of the second flange (18) and an adjoining curved portion of a corner area of the base housing (14), the L-shaped holding elements (25) are located at all of the corner areas of the base housing (14) such that the ventilator (30) is rotatable in a clockwise direction into the L-shaped holding elements (25), and the L-shaped holding elements (25) partially cover four sides of the second flange (18).

9. In a filter ventilator in accordance with claim 1, wherein the first detent cams (15) of the base housing (14) are positioned at a bottom (16) which is formed as a screen.

10. In a filter ventilator in accordance with claim 1, wherein a protective screen (21) is positioned on a side of the ventilator (30) facing away from the base housing (14), the protective screen (21) has a plurality of brackets (23) each with a third detent cam (22) and a detent receiver (24) in an end area of the corresponding bracket (23), the flange (18) of the ventilator (30) has a plurality of third bores (20) which correspondingly engage with the third detent cams (22), the brackets (23) of the protective screen (21) form a plurality of detent receivers (24), and when rotating the ventilator (30) with the protective screen (21) the second detent cams (27) of the L-shaped holding elements (25) engage with the detent receivers (24).

11. In a filter ventilator in accordance with claim 10, wherein the third detent cams (22) and the dent receiver (24) of the protective screen (21) are axially aligned with each other.

12. In a filter ventilator in accordance with claim 5, wherein a distance of each of the end sections (26) of the L-shaped holding elements (25) from the bottom (16) of the base housing (14) corresponds to a structural height of the ventilator (30) and the brackets (23) of the protective screen (21).

* * * * *